(12) United States Patent
Lu (10) Patent No.: US 12,154,918 B2
(45) Date of Patent: Nov. 26, 2024

(54) DISPLAY PANEL AND MOBILE TERMINAL

(71) Applicant: Shenzhen China Star Optoelectronics Semiconductor Display Technology Co., Ltd., Shenzhen (CN)

(72) Inventor: Zhitao Lu, Shenzhen (CN)

(73) Assignee: Shenzhen China Star Optoelectronics Semiconductor Display Technology Co., Ltd., Shenzhen (CN)

( * ) Notice: Subject to any disclaimer, the term of this patent is extended or adjusted under 35 U.S.C. 154(b) by 0 days.

(21) Appl. No.: 17/622,623

(22) PCT Filed: Dec. 15, 2021

(86) PCT No.: PCT/CN2021/138346
§ 371 (c)(1),
(2) Date: Dec. 23, 2021

(87) PCT Pub. No.: WO2023/102973
PCT Pub. Date: Jun. 15, 2023

(65) Prior Publication Data
US 2024/0030247 A1    Jan. 25, 2024

(30) Foreign Application Priority Data
Dec. 6, 2021 (CN) .......................... 202111480754.8

(51) Int. Cl.
*H01L 27/146* (2006.01)
(52) U.S. Cl.
CPC .. *H01L 27/14614* (2013.01); *H01L 27/14643* (2013.01); *H01L 27/14603* (2013.01)

(58) Field of Classification Search
CPC ......... H01L 27/14614; H01L 27/14643; H01L 27/14603; H01L 27/14605;
(Continued)

(56) References Cited

U.S. PATENT DOCUMENTS

| 9,870,827 B2 * | 1/2018 | Nakagawa ............... G11C 7/16 |
| 10,027,896 B2 * | 7/2018 | Ikeda ..................... H04N 23/63 |

(Continued)

FOREIGN PATENT DOCUMENTS

| CN | 103411669 A | 11/2013 |
| CN | 103762251 A | 4/2014 |

(Continued)

OTHER PUBLICATIONS

International Search Report in International application No. PCT/CN2021/138346, mailed on Sep. 5, 2022.
(Continued)

*Primary Examiner* — Eduardo A Rodela
(74) *Attorney, Agent, or Firm* — PV IP PC; Wei Te Chung (57) ABSTRACT

The present application provides a display panel and a mobile terminal. A light sensing module of the display panel includes a dual-gate transistor, which includes a first gate connected to a first control signal end, a second gate connected to a second control signal end, a first electrode connected to a first power-supply end, and a second electrode connected to a read-out module. The light sensing module further includes a first storage capacitor, which includes a first electrode plate connected to one of the first control signal end or the second control signal end, and a second electrode plate connected to the read-out module.

20 Claims, 5 Drawing Sheets

(58) Field of Classification Search
CPC ......... H01L 27/14609; H01L 27/14612; H01L 27/14636
See application file for complete search history.

(56) References Cited

U.S. PATENT DOCUMENTS

| | | | |
|---|---|---|---|
| 10,096,631 B2 * | 10/2018 | Ishizu | ................... G11C 8/16 |
| 10,347,681 B2 * | 7/2019 | Kurokawa | .......... H01L 27/1461 |
| 10,504,984 B2 * | 12/2019 | Gu | ..................... G09G 3/3233 |
| 11,594,161 B2 * | 2/2023 | Takatori | ................ H04N 25/62 |
| 2002/0054394 A1 | 5/2002 | Sasaki et al. | |

FOREIGN PATENT DOCUMENTS

| | | |
|---|---|---|
| CN | 106940602 A | 7/2017 |
| CN | 108227993 A | 6/2018 |
| CN | 108735782 A | 11/2018 |
| CN | 112259581 A | 1/2021 |
| CN | 113156678 A | 7/2021 |
| CN | 113421942 A | 9/2021 |
| CN | 113437099 A | 9/2021 |
| WO | 2018023424 A1 | 2/2018 |

OTHER PUBLICATIONS

Written Opinion of the International Search Authority in International application No. PCT/CN2021/138346, mailed on Sep. 5, 2022.
Chinese Office Action issued in corresponding Chinese Patent Application No. 202111480754.8 dated Feb. 1, 2023, pp. 1-8.

\* cited by examiner

DISPLAY PANEL AND MOBILE TERMINAL

FIELD OF THE DISCLOSURE

The present invention relates to display technologies, and more particularly to a display panel and a mobile terminal.

DESCRIPTION OF RELATED ARTS

With development of display technologies, a remote interaction technology that integrates light control sensors into a display panel and uses laser as a source for control operations attracts people's attention.

Figure 1:
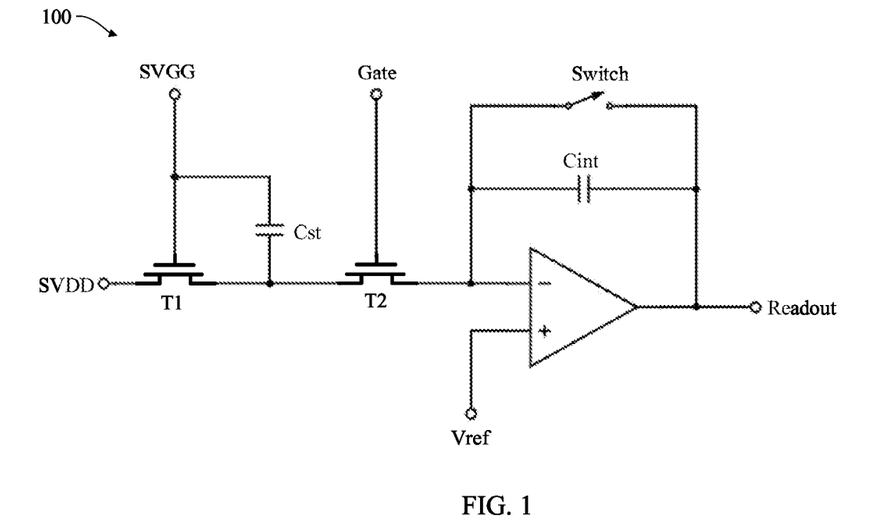
FIG. 1 is a circuit diagram of an existing light control sensor.
Figure 2:
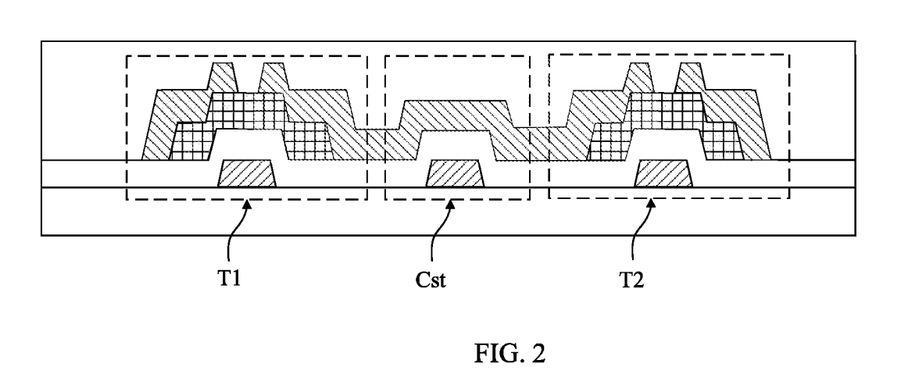
FIG. 2 is a film structure diagram of an existing light control sensor.

FIG. 1 is a circuit diagram of an existing light control sensor 100. FIG. 2 is a film structure diagram of an existing light control sensor. The existing light control sensor 100 includes a light sensing transistor T1, a switch transistor T2, a storage capacitor Cst and a readout module. The gate of the light sensing transistor T1 is connected to a first control source SVGG, the source of the light sensing transistor T1 is connected to power supply SVDD, the drain of the light sensing transistor T1 is connected to one end of the storage capacitor Cst and the source of the switch transistor T2. The second end of the storage capacitor Cst is connected to the first control source SVGG. The gate of the switch transistor T2 is connected to a second control source Gate, and the drain of the switch transistor T2 is connected to a readout circuit.

With reference to the structures of FIG. 1 and FIG. 2, the switch transistor T2 and the light sensing transistor T1 are separate, and the drains and sources of the two transistors are connected via a metal layer. Therefore, the two non-transparent transistors of the existing light control sensor 100 occupy a relatively large display area in a sub-pixel. This reduces the aperture ratio of the display panel.

Therefore, there is an urgent need for a display panel to solve above problems.

SUMMARY

Technical Problems

The present application provides a display panel and a mobile terminal, for solving the problem of low aperture ratio of the existing display panel.

Technical Solutions

The present application provides a display panel, including a light sensing module and a read-out module connected to the light sensing module, the light sensing module including:
  a dual-gate transistor, including a first gate connected to a first control signal end and a second gate connected to a second control signal end, a first electrode of the dual-gate transistor connected to a first power-supply end, a second electrode of the dual-gate transistor connected to the read-out module; and
  a first storage capacitor, a first electrode plate of the first storage capacitor connected to one of the first control signal end or the second control signal end, a second electrode plate of the first storage capacitor connected to the read-out module.

In the display panel of the present application, the display panel includes:
  a first metal layer, including the first gate forming the dual-gate transistor;
  an active layer, disposed on the first metal layer;
  a second metal layer, disposed on the active layer, the second metal layer including the first electrode and the second electrode forming the dual-gate transistor; and
  a third metal layer, disposed above the second metal layer, the third metal layer including the second gate forming the dual-gate transistor.

In the display panel of the present application, the first electrode plate and one of the first metal layer or the third metal layer are disposed in a same layer, and the second electrode plate and the second metal layer are disposed in a same layer.

In the display panel of the present application, the light sensing module further includes a second storage capacitor, and the second storage capacitor including a third electrode plate and a fourth electrode plate,
  wherein the third electrode plate is connected to the other one of the first control signal end or the second control signal end, and the fourth electrode plate is connected to the read-out module.

In the display panel of the present application, the third electrode plate and the other one of the first metal layer or the third metal layer are disposed in a same layer, and the fourth electrode plate and the second electrode plate are shared.

In the display panel of the present application, among the first storage capacitor and the second storage capacitor, capacitance of the storage capacitor located away from the first metal layer is greater than capacitance of the storage capacitor located close to the first metal layer.

In the display panel of the present application, the display panel includes:
  a first gate insulating layer, disposed between the first metal layer and the second metal layer; and
  a second gate insulating layer, disposed between the second metal layer and the third metal layer,
  wherein the first electrode plate, the first gate insulating layer, the second electrode plate, the second gate insulating layer and the third electrode plate are made of transparent material.

In the display panel of the present application, the first metal layer further includes:
  a gate transmission portion, disposed in a same layer as the first gate, the second gate electrically connected to the gate transmission portion via a wire switching hole.

In the display panel of the present application, the read-out module includes:
  an operational amplifier, including an inverting input end, a non-inverting input end and an output end, the non-inverting input end connected to a voltage comparing end, the inverting input end connected to the second electrode of the dual-gate transistor and the second electrode plate of the first storage capacitor;
  a read-out capacitor, connected in parallel with the operational amplifier; and
  a first switch, connected in parallel with the operational amplifier and the read-out capacitor,
  wherein a first end of the read-out capacitor is connected to a first end of the first switch and the inverting input end of the operational amplifier, and a second end of the read-out capacitor is connected to a second end of the first switch and the output end of the operational amplifier.

The present application further provides a mobile terminal, including a terminal body and the afore-described display panel. The terminal body and the display panel are combined as one.

Beneficial Effects

In the present application, the dual-gate transistor including the first gate and the second gate, and the source and the drain sharing a common active layer is provided on the display panel. The dual-gate transistor can realize the functions of the light sensing transistor and the switch transistor in different time periods. This reduces the area of the light sensing module and improves the aperture ratio of the display panel.

DESCRIPTION OF EMBODIMENTS OF THE DISCLOSURE

To make the objectives, technical schemes, and effects of the present application more clear and specific, the present application is described in further detail below with reference to the embodiments in accompanying with the appending drawings. It should be understood that the specific embodiments described herein are merely for interpreting the present application and the present application is not limited thereto.

Figure 3:
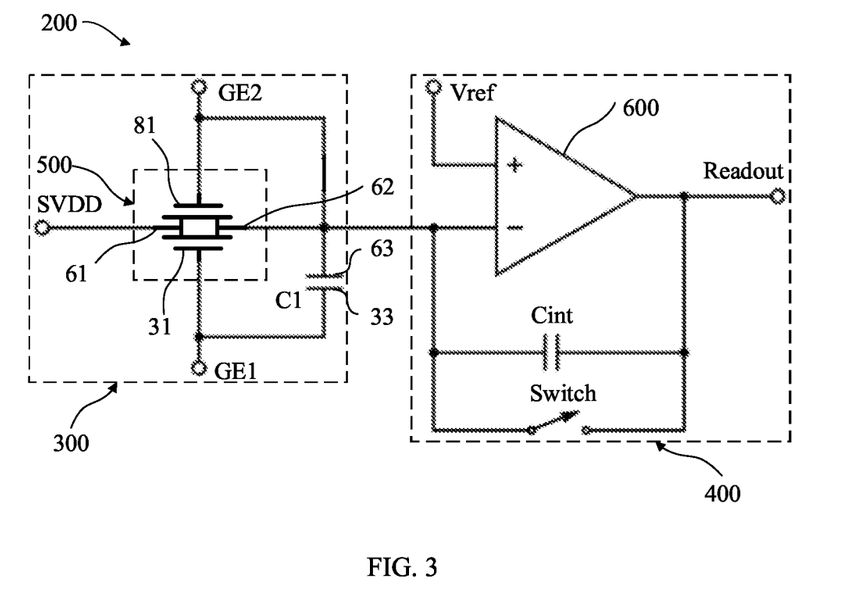
FIG. 3 is a first type of circuit diagram of a light sensing module in a display panel of the present application.
Figure 4:
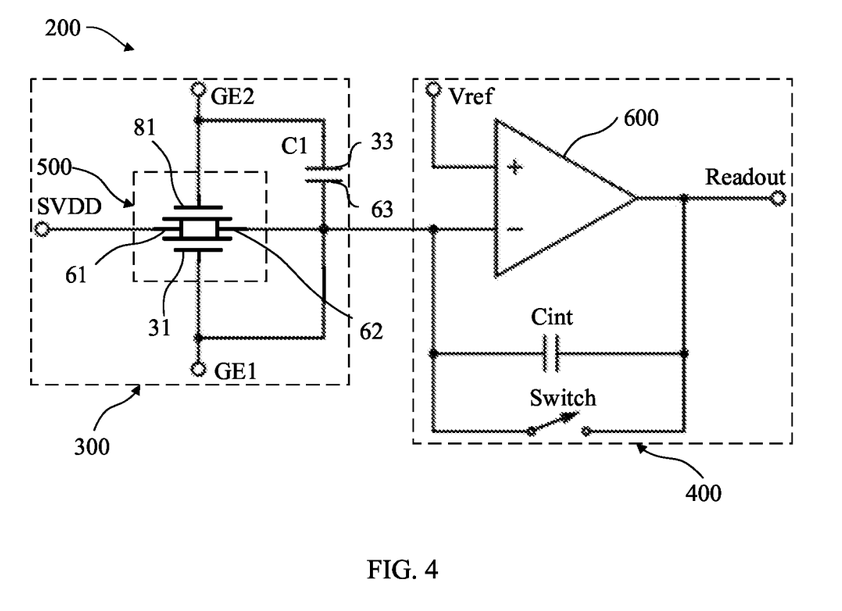
FIG. 4 is a second type of circuit diagram of a light sensing module in a display panel of the present application.
Figure 5:
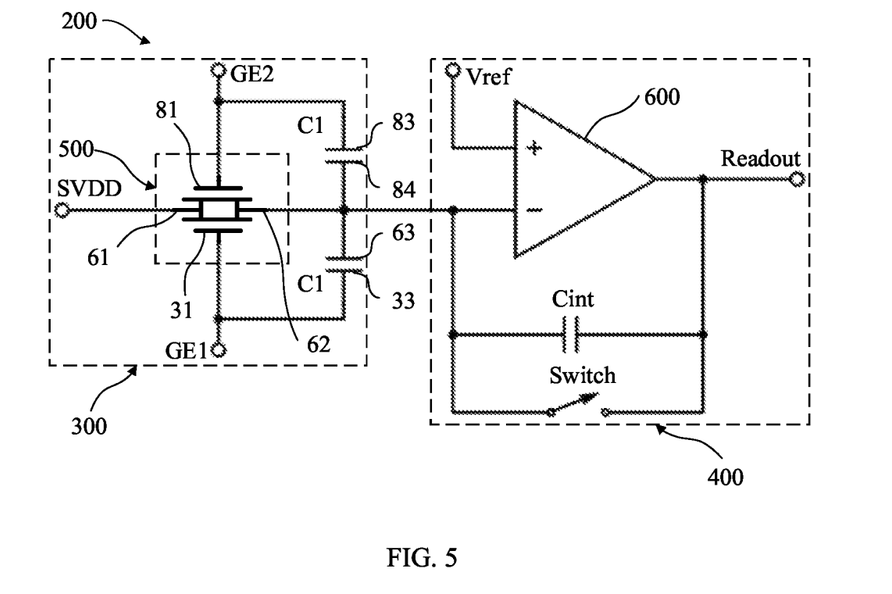
FIG. 5 is a third type of circuit diagram of a light sensing module in a display panel of the present application.

Referring to FIGS. 3 to 5, the present application provides a display panel 200, which includes a light sensing module 300 and a read-out module 400 connected to the light sensing module 300. The light sensing module 300 includes:

a dual-gate transistor 500, including a first gate 31 connected to a first control signal end GE1 and a second gate 81 connected to a second control signal end GE2, a first electrode 61 of the dual-gate transistor 500 connected to a first power-supply end SVDD, a second electrode 62 of the dual-gate transistor connected to the read-out module 400; and a first storage capacitor C1, a first electrode plate 33 of the first storage capacitor C1 connected to one of the first control signal end GE1 or the second control signal end GE2, a second electrode plate 63 of the first storage capacitor C1 connected to the read-out module 400.

It should be noted that the first electrode 61 of the dual-gate transistor 500 is one of a drain or a source, and the second electrode 62 of the dual-gate transistor 500 is the other one of the drain or the source. For example, the first electrode 61 is the source of the dual-gate transistor 500, and the second electrode 62 is the drain of the dual-gate transistor 500.

It should be noted that the first gate 31, the first electrode 61 and the second electrode 62 may constitute a switch transistor, and the second gate 81, the first electrode 61 and the second electrode 62 may constitute a light sensing transistor. A combination of the light sensing transistor and the switch transistor forms the dual-gate transistor 500 with both light sensing and switching functions.

In the present embodiment, referring to FIG. 3, the first electrode plate 33 of the first storage capacitor C1 can be connected to the first control signal end GE1, and the second electrode plate 63 of the first storage capacitor C1 can be connected to the read-out module 400. Referring to FIG. 4, the first electrode plate 33 of the first storage capacitor C1 can be connected to the second control signal end GE2, and the second electrode plate 63 of the first storage capacitor C1 can be connected to the read-out module 400.

In the present embodiment, the light sensing modules 300 are disposed in sub-pixels of the display panel 200 and are configured to sense changes of light intensity to realize touch sensing, fingerprint recognition, and optical interaction over distance, and so on.

In the present embodiment, referring to FIGS. 3 and 4, the read-out module 400 may include an operational amplifier 600, a read-out capacitor Cint and a first switch Switch. The operational amplifier 600 includes an inverting input end, a non-inverting input end and an output end (as shown in the operational amplifier 600 in FIGS. 3 and 4, "−" indicates the inverting input end and "+" indicates the non-inverting input end). The non-inverting input end is connected to a voltage comparing end Vref. The inverting input end is connected to the second electrode 62 of the dual-gate transistor 500 and the second electrode plate 63 of the first storage capacitor C1. The read-out capacitor Cint is connected in parallel with the operational amplifier 600. The first switch Switch is connected in parallel with the operational amplifier 600 and the read-out capacitor Cint. A first end of the read-out capacitor Cint is connected to a first end of the first switch Switch and the inverting input end of the operational amplifier 600. A second end of the read-out capacitor Cint is connected to a second end of the first switch Switch and the output end of the operational amplifier 600. The output end of the operational amplifier 600 is also connected to a read-out line Readout. The read-out line Readout is configured to output a light sensing signal.

In the present embodiment, the read-out capacitor Cint is an integrating capacitor.

In the present embodiment, referring to FIG. 5, the light sensing module 300 may further include a second storage capacitor C2. The second storage capacitor C2 includes a third electrode plate 83 and a fourth electrode plate 84. The third electrode plate 83 is connected to the other one of the first control signal end GE1 or the second control signal end GE2. The fourth electrode plate 84 is connected to the read-out module 400. For example, referring to FIG. 5, the third electrode plate 83 is connected to the second control signal end GE2, and the fourth electrode plate 84 is connected to the read-out module 400.

In the present embodiment, the first storage capacitor C1 and the second storage capacitor C2 are connected in parallel, that is, the capacitance of the storage capacitors in the light sensing module 300 is a sum of the capacitance of the first storage capacitor C1 and the capacitance of the second storage capacitor C2. Compared to the structures shown in FIGS. 3 and 4, the structure of FIG. 5 increases the capacitance of the storage capacitors in the light sensing module 300. The storage capacitors are mainly used to temporarily store the electric power of photocurrent generated after the light sensing transistor senses light rays. An increase in capacitance of the storage capacitors improves the fault tolerance of leakage current generated by the light sensing transistor and avoids mismatching between the storage capacitors and corresponding leakage current.

Figure 6:
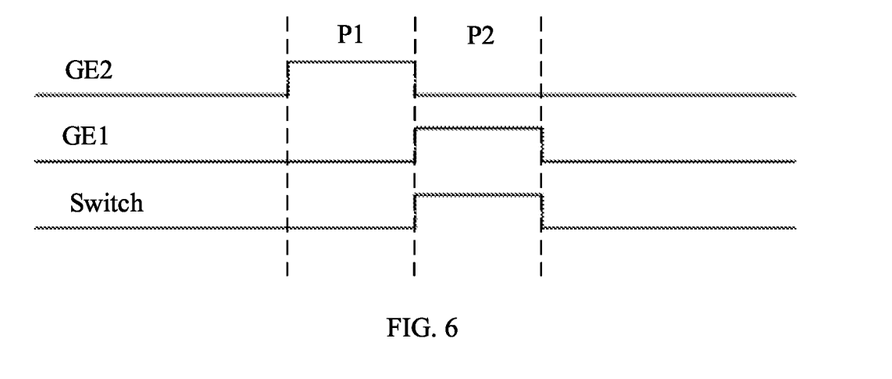
FIG. 6 is a timing diagram of the light sensing module in FIGS. 3 to 5.

FIG. 6 is a timing diagram of the light sensing module 300 in FIGS. 3 to 5. In the present embodiment, taking the structure of FIG. 5 for example, the operations of the light sensing module 300 includes the followings.

In a first phase P1, the first control signal end GE1 supplies a low-level voltage signal to the first gate 31 of the dual-gate transistor 500, and the second control signal end GE2 supplies a high-level voltage signal to the second gate 81 of the dual-gate transistor 500. Since the dual-gate transistor 500 is an N-type transistor, the switch transistor constituted by the first gate 31, the first electrode 61 and the second electrode 62 is in an open state and the light sensing transistor constituted by the second gate 81, the first electrode 61 and the second electrode 62 is in a closed state. The first electrode 61 of the dual-gate transistor 500 and the second electrode 62 of the dual-gate transistor 500 are conductive. The channel of the dual-gate transistor 500 generates a photo-induced leakage current for being irradiated by light rays and generates different magnitudes of leakage currents based on light intensity.

In the present embodiment, the electrical signal of the first power-supply line SVDD flows from the first electrode 61 of the dual-gate transistor 500 to the second electrode 62, and arrives at the second electrode plate 63 of the first storage capacitor C1 and the fourth electrode plate 84 of the second storage capacitor C2, and changes based on the photo-induced leakage current generated by the dual-gate transistor 500.

In the present embodiment, the first electrode plate 33 of the first storage capacitor C1 is connected to the first control signal end GE1, and the third electrode plate 83 of the second storage capacitor C2 is connected to the second control signal end GE1. Therefore, the first storage capacitor C1 and the second storage capacitor C2 are in a charging state, and the electrical signals charging the two capacitors include light sensing signals.

In addition, in the first phase P1, the first switch Switch is in an open state.

In a second phase P2, the first control signal end GE1 supplies a high-level voltage signal to the first gate 31 of the dual-gate transistor 500, and the second control signal end GE2 supplies a low-level voltage signal to the second gate 81 of the dual-gate transistor 500. Since the dual-gate transistor 500 is an N-type transistor, the switch transistor constituted by the first gate 31, the first electrode 61 and the second electrode 62 is in a closed state and the light sensing transistor constituted by the second gate 81, the first electrode 61 and the second electrode 62 is in an open state. At this time, the first storage capacitor C1 and the second storage capacitors C2 release the electric charges stored in the first phase P1 and transfer them to the read-out module 400.

In the second phase P2, the first switch Switch is closed, and the electric charges released by the first storage capacitor C1 and the second storage capacitor C2 will be transferred to the read-out capacitor Cint. In subsequent stages, the electrical signals stored in the read-out capacitor Cint will be read by external read-out line Readout.

In the present application, the dual-gate transistor 500 including the first gate 31 and the second gate 81, and the source and the drain sharing a common active layer 50 is provided on the display panel 200. The dual-gate transistor 500 can realize the functions of the light sensing transistor and the switch transistor in different time periods. This reduces the area of the light sensing module 300 and improves the aperture ratio of the display panel 200.

The film structure of the light sensing module 300 of the present application will now be described with reference to specific embodiments.

Figure 7:
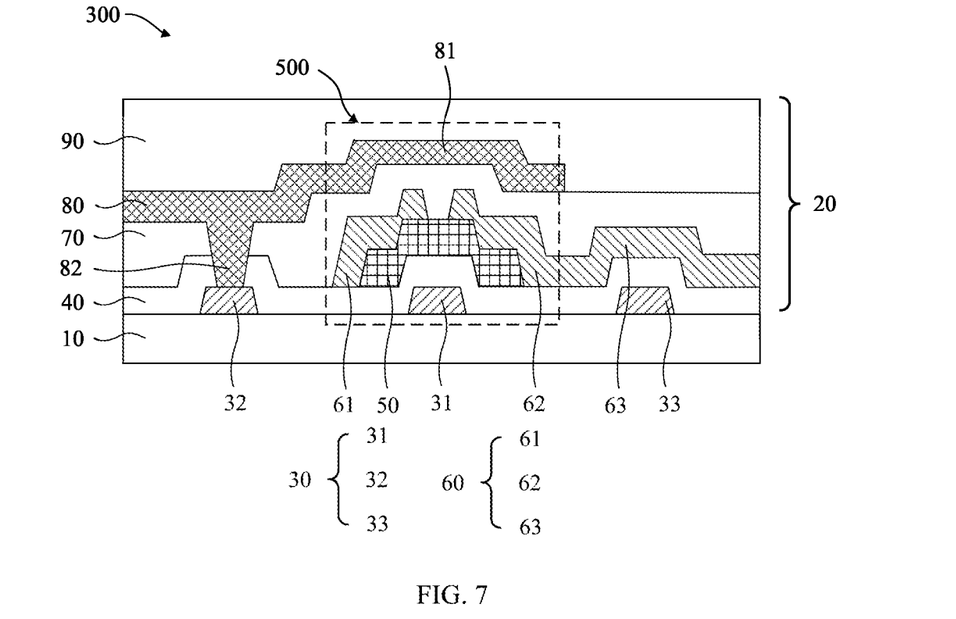
FIG. 7 is a first type of film structure diagram of a light sensing module in a display panel of the present application.
Figure 8:
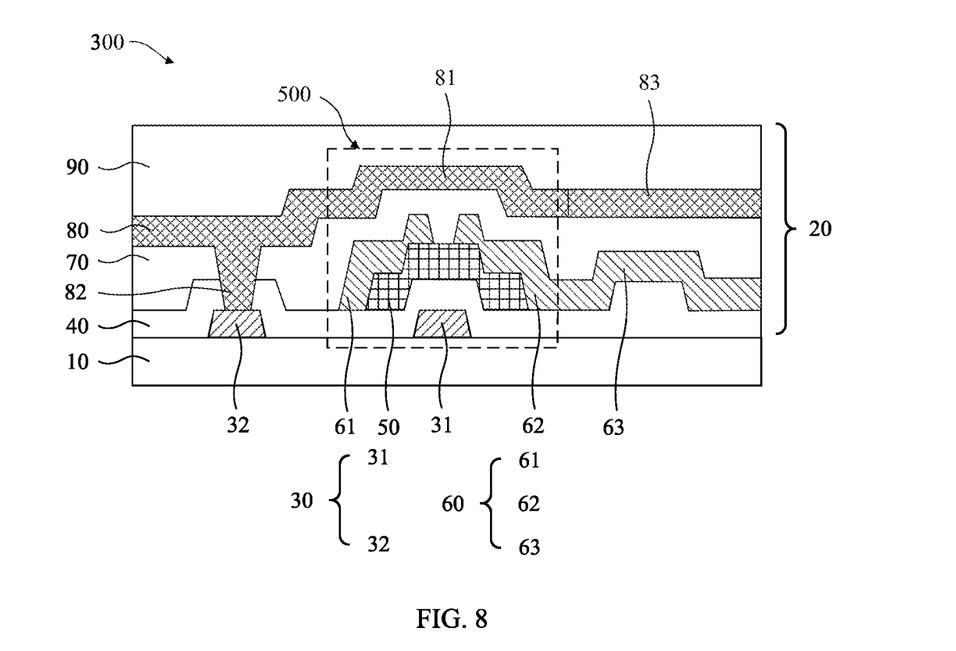
FIG. 8 is a second type of film structure diagram of a light sensing module in a display panel of the present application.
Figure 9:
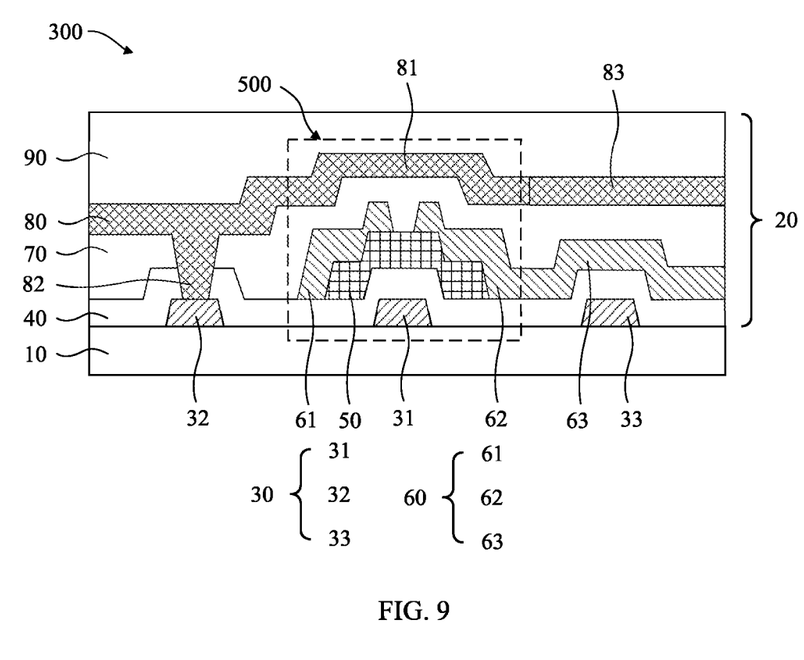
FIG. 9 is a third type of film structure diagram of a light sensing module in a display panel of the present application.

FIGS. 7-9 are cross-sectional views of the light sensing module 300 in the display panel 200 of the present application. The display panel 200 may include a substrate 10 and a thin-film transistor layer 20 located on the substrate 10.

In the present embodiment, the substrate 10 can be made of glass, quartz, or polyimide. The thin-film transistor layer 20 includes a plurality of thin-film transistors.

In the present embodiment, the thin-film transistor may be of an etch stop (ESL) type or a back channel etch (BCE) type, which are not specifically limited in the present embodiment.

In the display panel 200 of the present application, referring to FIGS. 7 to 9, the thin-film transistor layer 20 may include the followings.

A first metal layer 30: the first metal layer 30 is disposed on the substrate 10. The first metal layer 30 may include a plurality of gate lines and the first gate 31 forming the dual-gate transistor 500. The material of the first metal layer 30 may be copper, molybdenum, or molybdenum-titanium alloy.

A first gate insulating layer 40: the first gate insulating layer 40 is disposed on the first metal layer 30 and the first gate insulating layer 40 covers the first metal layer 30 such that the first metal layer 30 and a conductive layer on the first gate insulating layer 40 are separate. The material of the first gate insulating layer 40 may be silicon oxide or the like.

An active layer 50: the active layer 50 is disposed on the first gate insulating layer 40. The material of the active layer 50 may be Indium Gallium Zinc Oxide (IGZO), a-Si (Amorphous Silicon) or low-temperature polysilicon (LTPS). For example, the active layer 50 in FIGS. 7 to 9 is a-Si.

A second metal layer 60: the second metal layer 60 is disposed on the active layer 50. The second metal layer 60 may include a plurality of data lines, drains, sources, etc. The source is the first electrode 61 of the dual-gate transistor 500, and the drain is the second electrode 62 of the dual-gate transistor 500. The drain and the source camp at two sides of the active layer 50 such that a middle channel portion of the active layer 50 is not shielded by a light-shielding metal layer. The material of the second metal layer 60 may be copper/molybdenum titanium alloy, copper/titanium, and so on.

A second gate insulating layer 40: the second gate insulating layer 70 is disposed on the second metal layer 60 and the second gate insulating layer 70 covers the second metal layer 60 such that the second metal layer 60 and a conductive layer on the second gate insulating layer 70 are separate. The material and thickness of the second gate insulating layer 70 may be as the same as those of the first gate insulating layer 40.

A third metal layer 80: the third metal layer 80 is disposed above the second metal layer 60. The third metal layer 80 may include a pixel electrode and the second gate 81 forming the dual-gate transistor 500. Since the second gate 81 is close to a light exit side of the display panel 200, light rays will have to pass through the second gate 81 so as to irradiate at the active layer 50 of the dual-gate transistor 500 to generate corresponding leakage current. Therefore, the material of the second gate 81 needs to be a transparent material such that the light rays can penetrate the second gate 81 to arrive at the active layer 50. The material of the third metal layer 80 may be indium tin oxide (ITO).

A protection layer 90: the protection layer 90 is disposed on the third metal layer and the protection layer 90 covers the third metal layer 80. The material of the protection layer 90 may be an inorganic compound consisted of nitrogen, oxygen and silicon, or an organic material with certain flatness.

In the present embodiment, the first gate 31, the active layer 50, the first electrode 61 and the second electrode 62 may constitute the switch transistor, and the second gate 81, the active layer 50, the first electrode 61 and the second electrode 62 may constitute the light sensing transistor. The light sensing transistor and the switch transistor share the active layer 50, the first electrode 61 and the second electrode 62 such that a combination of the light sensing transistor and the switch transistor forms the dual-gate transistor 500 with both light sensing and switching functions. This reduces the area of the light sensing module 300 and improves the aperture ratio of the display panel 200.

In the display panel 200 of the present application, referring to FIGS. 7 and 8, the display panel 200 further includes the first storage capacitor C1. The first electrode plate 33 and one of the first metal layer 30 or the third metal layer 80 are disposed in a same layer, and the second electrode plate 63 and the second metal layer 60 are disposed in a same layer.

Please refer to FIG. 7. The structure shown in FIG. 7 corresponds to the structure of FIG. 3.

In the present embodiment, the first electrode plate 33 of the first storage capacitor C1 and the first metal layer 30 are disposed in a same layer, and the second electrode plate 63 of the first storage capacitor C1 and the second metal layer 60 are disposed in a same layer. That is, in the process of patterning the first metal layer 30, the first electrode plate 33 is also formed while the first gate 31 is formed. In addition, the second electrode plate 63 is also formed while the drain and the source are formed. This simplifies the manufacturing processes of the first storage capacitor C1.

Please refer to FIG. 8. The structure shown in FIG. 8 corresponds to the structure of FIG. 4.

In the present embodiment, the first electrode plate 33 of the first storage capacitor C1 and the third metal layer 80 are disposed in a same layer, and the second electrode plate 63 of the first storage capacitor C1 and the second metal layer 60 are disposed in a same layer. That is, in the process of patterning the third metal layer 80, the first electrode plate 33 is also formed while the pixel electrode is formed. In addition, the second electrode plate 63 is also formed while the drain and the source are formed. This simplifies the manufacturing processes of the first storage capacitor C1.

In the display panel 200 of the present application, the display panel 200 further includes the second storage capacitor C2, and the third electrode plate 83 of the second storage capacitor C2 and the other one of the first metal layer 30 or the third metal layer 80 can be disposed in a same layer, and the fourth electrode plate 84 of the second storage capacitor C2 and the second electrode plate 63 can be shared.

Please refer to FIG. 9. The structure shown in FIG. 9 corresponds to the structure of FIG. 5.

In the present embodiment, the present application combines the structures of FIG. 7 and FIG. 8, that is, the second storage capacitor C2 is added to the light sensing module 300 such that the first storage capacitor C1 and the second storage capacitor C2 are connected in parallel. In FIG. 9, the third electrode plate 83 of the second storage capacitor C2 and the third metal layer 80 are disposed in a same layer, that is, in the process of patterning the third metal layer 80, the third electrode plate 83 is also formed while the pixel electrode is formed. In addition, the fourth electrode plate 84 of the second storage capacitor C2 and the second electrode plate 63 of the first storage capacitor C1 are shared.

In the present embodiment, from the perspective of top view of the display panel 200, the first electrode plate 33, the second electrode plate 63 and the third electrode plate 83 are stacked such that an additional storage capacitor is added under the circumstance that a same area is occupied by the storage capacitor in a corresponding sub-pixel. This increases the capacitance of the storage capacitor.

In the present embodiment, for the first storage capacitor C1 and the second storage capacitor C2, the capacitance of the storage capacitor located away from the first metal layer 30 is greater than the capacitance of the storage capacitor located close to the first metal layer 30. In the structure of FIG. 9, since there are a large number of gate lines and a plurality of gates in the first metal layer 30, the area occupied by the first electrode plate 33 is relatively small. In contrast, since it only needs to dispose corresponding pixel electrodes in the third metal layer 80, the area occupied by the third electrode plate 83 may be relatively large. Because the capacitance of the capacitor is positively correlated with the area of two electrode plates, the capacitance of the first storage capacitor C1 of the present application is smaller than the capacitance of the second storage capacitor C2.

In the display panel 200 of the present application, the first gate insulating layer 40 is disposed between the first electrode plate 33 and the second electrode plate 63, and the second gate insulating layer 70 is disposed between the second electrode plate 63 and the third electrode plate 83. The first electrode plate 33, the first gate insulating layer 40, the second electrode plate 63, the second gate insulating layer 70 and the third electrode plate 83 are made of transparent material.

In the present embodiment, since the storage capacitors also occupy a certain area in the sub-pixel. When the metal forming the first storage capacitor C1 and the second storage capacitor C2 is a non-transparent material, the area is a non-transparent area. However, in the present application, the electrode plates forming the first storage capacitor C1 and the second storage capacitor C2 and the dielectric materials between the electrode plates are all configured as transparent material such that the light rays can pass through the area of the storage capacitors. This increases the aperture ratio of the sub-pixels.

In the display panel 200 of the present application, referring to FIGS. 7 to 9, the first metal layer 30 further includes a gate transmission portion 32, which is disposed in a same layer as the first gate 31. The second gate 81 is electrically connected to the gate transmission portion 32 via a wire switching hole 82.

In the present embodiment, the second gate 81 is made of transparent material with relatively high impedance, such as indium tin oxide. In order to reduce the impedance in transmitting the gate signals, the present application additionally arranges the gate transmission portion 32 in the first metal layer 30. The gate signals of the gate transmission section 32 are transmitted to the second gate 81 by means of wire switching.

In the present embodiment, the wire switching hole 82 penetrates the first gate insulating layer 40 and the second gate insulating layer 70.

In the display panel 200 of the present application, the display panel 200 can be divided into a display stage and a light sensing stage within one frame. The light sensing module 300 is configured to operate in the light sensing stage, and display unit is configured to operate in the display stage. The display panel 200 having the light sensing module 300 can realize touch sensing, fingerprint recognition, optical interaction over distance, and so on. Also, integrating the light sensing module 300 into the display panel 200 can reduce the overall thickness of the display panel 200.

The present application further provides a mobile terminal, including a terminal body and the afore-described display panel 200. The terminal body and the display panel 200 are combined as one. The terminal body may be a circuit board or other devices bound to the display panel 200, and a cover plate covering the display panel 200, and so on. The mobile terminal may include electronic devices such as mobile phones, televisions, and notebook computers.

The present application provides a display panel and a mobile terminal. The display panel includes a light sensing module and a read-out module connected to the light sensing module. The light sensing module includes a dual-gate transistor, including a first gate connected to a first control signal end and a second gate connected to a second control signal end, a first electrode of the dual-gate transistor connected to a first power-supply end, a second electrode of the dual-gate transistor connected to the read-out module. The light sensing module further includes a first storage capacitor, a first electrode plate of the first storage capacitor connected to one of the first control signal end or the second control signal end, a second electrode plate of the first storage capacitor connected to the read-out module. In the present application, the dual-gate transistor including the first gate and the second gate, and the source and the drain sharing a common active layer is provided on the display panel. The dual-gate transistor can realize the functions of the light sensing transistor and the switch transistor in different time periods. This reduces the area of the light sensing module and improves the aperture ratio of the display panel.

It should be understood that those of ordinary skill in the art may make equivalent modifications or variations according to the technical schemes and invention concepts of the present application, but all such modifications and variations should be within the appended claims of the present application.

The invention claimed is:

1. A display panel, comprising a light sensing module and a read-out module connected to the light sensing module, the light sensing module comprising:
 a dual-gate transistor, comprising a first gate connected to a first control signal end and a second gate connected to a second control signal end, a first electrode of the dual-gate transistor connected to a first power-supply end, a second electrode of the dual-gate transistor connected to the read-out module; and
 a first storage capacitor, a first electrode plate of the first storage capacitor connected to one of the first control signal end or the second control signal end, a second electrode plate of the first storage capacitor connected to the read-out module.

2. The display panel of claim 1, further comprising:
 a first metal layer, comprising the first gate forming the dual-gate transistor;
 an active layer, disposed on the first metal layer;
 a second metal layer, disposed on the active layer, the second metal layer comprising the first electrode and the second electrode forming the dual-gate transistor; and
 a third metal layer, disposed above the second metal layer, the third metal layer comprising the second gate forming the dual-gate transistor.

3. The display panel of claim 2, wherein the first electrode plate and one of the first metal layer or the third metal layer are disposed in a same layer, and the second electrode plate and the second metal layer are disposed in a same layer.

4. The display panel of claim 3, wherein the light sensing module further comprises a second storage capacitor, and the second storage capacitor comprising a third electrode plate and a fourth electrode plate,
 wherein the third electrode plate is connected to the other one of the first control signal end or the second control signal end, and the fourth electrode plate is connected to the read-out module.

5. The display panel of claim 4, wherein the third electrode plate and the other one of the first metal layer or the third metal layer are disposed in a same layer, and the fourth electrode plate and the second electrode plate are shared.

6. The display panel of claim 5, wherein among the first storage capacitor and the second storage capacitor, capacitance of the storage capacitor located away from the first metal layer is greater than capacitance of the storage capacitor located close to the first metal layer.

7. The display panel of claim 5, further comprising:
 a first gate insulating layer, disposed between the first metal layer and the second metal layer; and
 a second gate insulating layer, disposed between the second metal layer and the third metal layer.

8. The display panel of claim 5, wherein the first electrode plate, the first gate insulating layer, the second electrode plate, the second gate insulating layer and the third electrode plate are made of transparent material.

9. The display panel of claim 2, wherein the first metal layer further comprises:
 a gate transmission portion, disposed in a same layer as the first gate, the second gate electrically connected to the gate transmission portion via a wire switching hole.

10. The display panel according to claim 1, wherein the read-out module comprises:
 an operational amplifier, comprising an inverting input end, a non-inverting input end and an output end, the non-inverting input end connected to a voltage comparing end, the inverting input end connected to the second electrode of the dual-gate transistor and the second electrode plate of the first storage capacitor;
 a read-out capacitor, connected in parallel with the operational amplifier; and
 a first switch, connected in parallel with the operational amplifier and the read-out capacitor,
 wherein a first end of the read-out capacitor is connected to a first end of the first switch and the inverting input end of the operational amplifier, and a second end of the read-out capacitor is connected to a second end of the first switch and the output end of the operational amplifier.

11. A mobile terminal, comprising a terminal body and a display panel, which are combined as one, the display panel comprising a light sensing module and a read-out module connected to the light sensing module, the light sensing module comprising:
 a dual-gate transistor, comprising a first gate connected to a first control signal end and a second gate connected to a second control signal end, a first electrode of the dual-gate transistor connected to a first power-supply end, a second electrode of the dual-gate transistor connected to the read-out module; and a first storage capacitor, a first electrode plate of the first storage capacitor connected to one of the first control signal end or the second control signal end, a second electrode plate of the first storage capacitor connected to the read-out module.

12. The mobile terminal of claim 11, wherein the display panel further comprises:
a first metal layer, comprising the first gate forming the dual-gate transistor;
an active layer, disposed on the first metal layer;
a second metal layer, disposed on the active layer, the second metal layer comprising the first electrode and the second electrode forming the dual-gate transistor; and
a third metal layer, disposed above the second metal layer, the third metal layer comprising the second gate forming the dual-gate transistor.

13. The mobile terminal of claim 12, wherein the first electrode plate and one of the first metal layer or the third metal layer are disposed in a same layer, and the second electrode plate and the second metal layer are disposed in a same layer.

14. The mobile terminal of claim 13, wherein the light sensing module further comprises a second storage capacitor, and the second storage capacitor comprising a third electrode plate and a fourth electrode plate,
wherein the third electrode plate is connected to the other one of the first control signal end or the second control signal end, and the fourth electrode plate is connected to the read-out module.

15. The mobile terminal of claim 14, wherein the third electrode plate and the other one of the first metal layer or the third metal layer are disposed in a same layer, and the fourth electrode plate and the second electrode plate are shared.

16. The mobile terminal of claim 15, wherein among the first storage capacitor and the second storage capacitor, capacitance of the storage capacitor located away from the first metal layer is greater than capacitance of the storage capacitor located close to the first metal layer.

17. The mobile terminal of claim 15, wherein the display panel further comprises:
a first gate insulating layer, disposed between the first metal layer and the second metal layer; and
a second gate insulating layer, disposed between the second metal layer and the third metal layer.

18. The mobile terminal of claim 15, wherein the first electrode plate, the first gate insulating layer, the second electrode plate, the second gate insulating layer and the third electrode plate are made of transparent material.

19. The mobile terminal of claim 12, wherein the first metal layer further comprises:
a gate transmission portion, disposed in a same layer as the first gate, the second gate electrically connected to the gate transmission portion via a wire switching hole.

20. The mobile terminal of claim 11, wherein the read-out module comprises:
an operational amplifier, comprising an inverting input end, a non-inverting input end and an output end, the non-inverting input end connected to a voltage comparing end, the inverting input end connected to the second electrode of the dual-gate transistor and the second electrode plate of the first storage capacitor;
a read-out capacitor, connected in parallel with the operational amplifier; and
a first switch, connected in parallel with the operational amplifier and the read-out capacitor,
wherein a first end of the read-out capacitor is connected to a first end of the first switch and the inverting input end of the operational amplifier, and a second end of the read-out capacitor is connected to a second end of the first switch and the output end of the operational amplifier.

* * * * *